United States Patent [19]

Dhong et al.

[11] Patent Number: 5,621,696
[45] Date of Patent: Apr. 15, 1997

[54] VIRTUAL MULTIPLE-READ PORT MEMORY ARRAY

[75] Inventors: Sang H. Dhong, Austin, Tex.; Joseph J. Nocera, Jr., Pleasant Valley, N.Y.

[73] Assignee: IBM Corporation, Armonk, N.Y.

[21] Appl. No.: 626,613

[22] Filed: Jan. 26, 1996

[51] Int. Cl.[6] ................................................. G11C 8/02
[52] U.S. Cl. .......................... 365/230.05; 365/189.02; 365/230.02; 365/230.06
[58] Field of Search ..................... 365/230.05, 230.06, 365/230.02, 189.02

[56] References Cited

U.S. PATENT DOCUMENTS 5,544,122  8/1996  Mizukami et al. ................. 365/230.05

*Primary Examiner*—Joseph E. Clawson, Jr.
*Attorney, Agent, or Firm*—Whitham, Curtis, Whitham & McGinn; Robert P. Tassinari, Jr.

[57] ABSTRACT

Multiple reads are made from an array of single-read port memory cells. An array of single-read port memory cells is provided with "steering" devices located between a column of cells and the output drivers for the array. The steering devices are controlled by the read pointers such that the steering signal for a given output configuration is active only when read pointers for that output configuration are active. To complete the function, the read pointers are fed to OR gates, one per row, so that a given pointer will activate the read port of a plurality of consecutive memory cells. The read pointers represent the decoded read address and only one is active at a time.

3 Claims, 1 Drawing Sheet

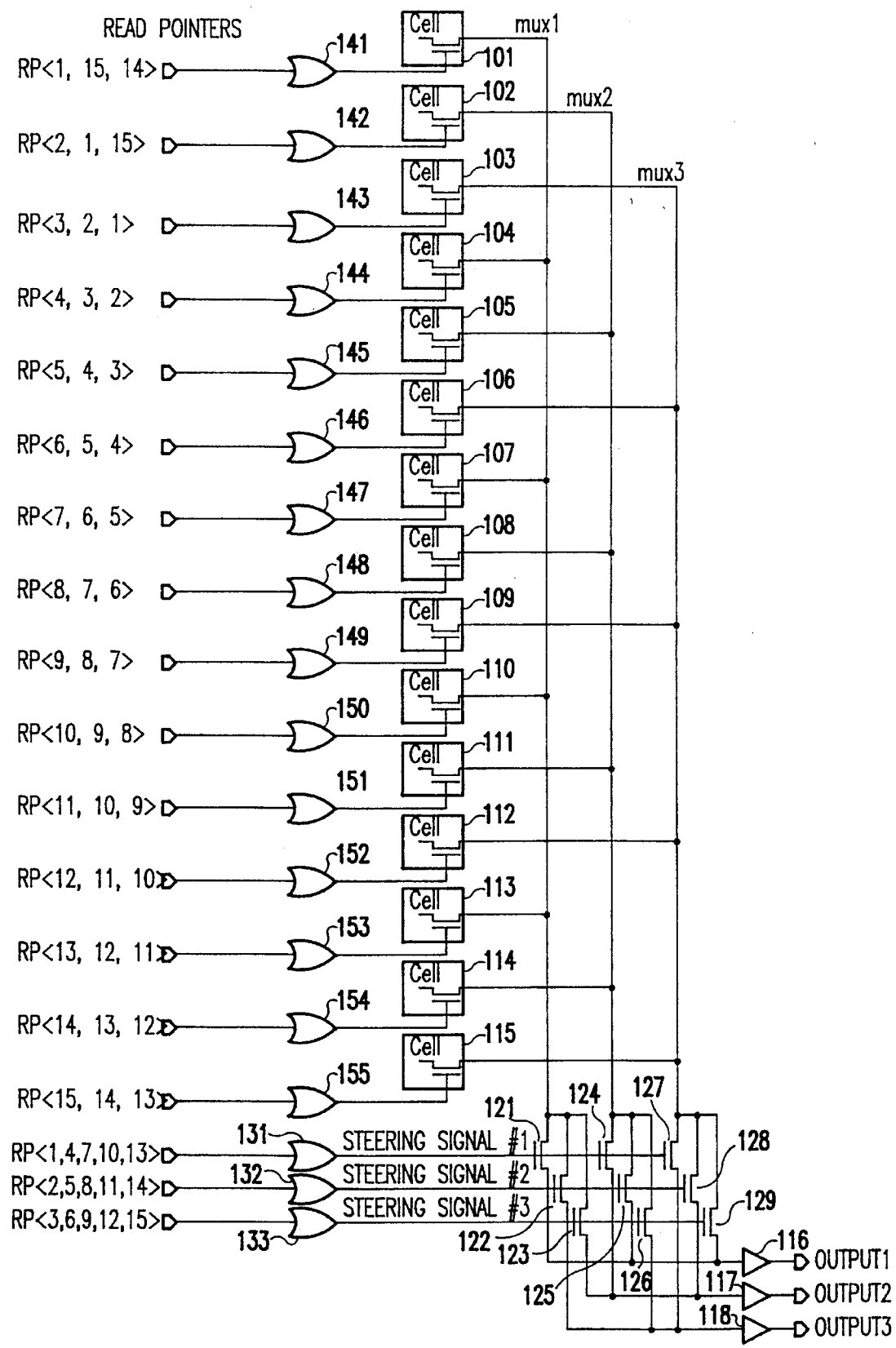

VIRTUAL MULTIPLE-READ PORT MEMORY ARRAY

CROSS REFERENCE TO RELATED APPLICATIONS

The present application claims priority to co-pending U.S. provisional application Ser. No. 60/004,190 filed Sep. 22, 1995.

BACKGROUND OF THE INVENTION

1. Field of the Invention

The present invention generally relates to virtual multiple-read port memory arrays and, more particularly, to a circuit and method for effectively providing multiple read ports for a memory array composed of single-read port memory cells.

2. Background Description

In an M-row by N-bit memory array, with P data outputs, multiple reads per cycle are generally accomplished by using memory cells which have multiple read ports; i.e., P read ports per cell. This is necessary for full random access reading. In cases where full random access is not required, the additional read ports in each cell become redundant, wasting valuable device area. Moreover, with the push to fabricate higher density memory arrays, multiple read ports consume valuable silicon real estate. What is needed is the higher densities allowed by single read port memory arrays but with the capability of multiple simultaneous reads.

SUMMARY OF THE INVENTION

It is therefore an object of the present invention to provide a circuit and method of performing multiple reads from an array of single-read port memory cells.

According to the invention, an array of single-read port memory cells is provided with "steering" devices located between a column of cells and the output drivers for the array. The steering devices are controlled by the read pointers such that the steering signal for a given output configurationh is active only when read pointers for that output configuration are active. To complete the function, the read pointers are fed to OR gates, one per row, so that a given pointer will activate the read port of a plurality of consecutive memory cells. The read pointers represent the decoded read address and only one is active at a time.

BRIEF DESCRIPTION OF THE DRAWINGS

The foregoing and other objects, aspects and advantages will be better understood from the following detailed description of a preferred embodiment of the invention with reference to the drawings, in which the sole figure is a simplified schematic diagram showing one bit column of the multiple-read memory array according to the preferred embodiment of the invention.

DETAILED DESCRIPTION OF A PREFERRED EMBODIMENT OF THE INVENTION

Referring now to the drawing, there is shown a one bit column of a memory array which has fifteen rows. The fifteen memory cells 101 to 115 associated with this column each have one read port. Also shown are three data output drivers 116, 117 and 118 allowing three simultaneous reads per cycle.

The key to the invention is the introduction of "steering" devices located between the column of cells and the output drivers. In the preferred embodiment of the invention, the steering devices comprise field effect transistors (FETs) connected as pass gates and perform a multiplexing function. In the example shown in the drawing, there are three groups of three FETs 121–123, 124–126 and 127–129. The bit lines from memory cells 101, 104, 107, 110, and 113 are connected in common to the sources of FETs 121–123, the bit lines from memory cells 102, 105, 108, 111, and 114 are connected in common to the sources of FETs 124–126, and the bit lines from memory cells 103, 106, 109, 112, and 115 are connected in common to the sources of FETs 127–129. The drains of FETs 121, 125 and 129 are connected in common to the input of output driver 116, the drains of FETs 122, 126 and 127 are connected in common to the input of output driver 118, and the drains of FETs 123, 124 and 128 are connected in common to the input of output driver 117.

The steering devices are controlled by steering signals generated by OR gates 131, 132 and 133 which receive as their inputs read pointers (RPs). Steering signal number 1 is active only when read pointer 1, 4, 7, 10, or 13 is active. Steering signal number 2 is active only when read pointer 2, 5, 8, 11, or 14 is active. And, steering signal number 3 is active only when read pointer 3, 6, 9, 12, or 15 is active. To complete the function, the read pointers are fed to OR gates 141 to 155, one per row, so that a given pointer will activate the read port of three consecutive memory cells. That is, read pointer 1 turns on the read ports of the cells 101, 102 and 103. Read pointer 2 turns on the read ports of the cells 102, 103 and 104. Read pointer 3 turns on the read ports of the cells 103, 104 and 105. And so on. The read pointers represent the decoded read address and only one is active at a time.

The end result is as follows:

When a given read pointer is asserted, the content of the memory cell in the corresponding row i will be read out via output 1. The content of the memory cell in the next row, i+1, will be read out via output 2. And the content of the memory cell in row i+2 will be read out via output 3.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A virtual multiple-read port memory array comprising:

an array of single-read port memory cells;

a plurality of output drivers for the array;

steering means located between a column of cells and the output drivers for the array for directing outputs of selected rows to corresponding ones of the output drivers, said steering means being controlled by read pointers such that a steering signal for a given output driver configuration is active only when read pointers for that output driver configuration are active, said read pointers representing a decoded read address and only one read pointer is active at a time; and a plurality of OR gates, one per row, receiving predetermined combinations of read pointers so that a given pointer will activate the read port of a plurality of consecutive memory cells.

2. The virtual multiple-read port memory array recited in claim 1 wherein in said steering means comprises:

multiplexing means receiving outputs from selected groups of memory cells and providing outputs to said output drivers in response to steering signals; and a second plurality of OR gates receiving second predetermined combinations of read pointers and outputting steering signals to said multiplexing means.

3. The virtual multiple-read port memory array recited in 2 wherein said multiplexing means comprises a plurality of groups of field effect transistors (FETs), one group of FETs for each of said selected groups of memory cells, sources of FETs within a group being connected in common to outputs of a corresponding group of memory cells and drains of FETs within a group being connected to different ones of said output drivers, said sterring signals being connected to gates of respective FETs within each group of FETs.

* * * * *

UNITED STATES PATENT AND TRADEMARK OFFICE
CERTIFICATE OF CORRECTION

PATENT NO. : 5,621,696
DATED : April 15, 1997
INVENTOR(S) : Dhong, et al.

It is certified that error appears in the above-identified patent and that said Letters Patent is hereby corrected as shown below:

ON THE TITLE PAGE
Item [73]

Please correct the Assignee as follows:
  International Business Machines Corporation, Armonk, New York

Signed and Sealed this

Twenty-third Day of December, 1997

Attest:

BRUCE LEHMAN

Attesting Officer

Commissioner of Patents and Trademarks